United States Patent
Shvartsberg et al.

(10) Patent No.: US 8,604,789 B2
(45) Date of Patent: Dec. 10, 2013

(54) RF COIL ASSEMBLY FOR USE IN MAGNETIC RESONANCE IMAGING

(75) Inventors: Alexander Shvartsberg, Winnipeg (CA); Wayne Theodore Schellekens, Winnipeg (CA); Mehran Fallah-Rad, Winnipeg (CA); Claude Turenne, St. Adolphe (CA)

(73) Assignee: Imris Inc., Winnipeg, MB (CA)

( * ) Notice: Subject to any disclaimer, the term of this patent is extended or adjusted under 35 U.S.C. 154(b) by 711 days.

(21) Appl. No.: 12/770,882

(22) Filed: Apr. 30, 2010

(65) Prior Publication Data

US 2011/0267059 A1 Nov. 3, 2011

(51) Int. Cl.
*G01V 3/00* (2006.01)
(52) U.S. Cl.
USPC .......................................... 324/318; 600/422
(58) Field of Classification Search
USPC .......................... 324/318, 319, 322; 600/422
See application file for complete search history.

(56) References Cited

U.S. PATENT DOCUMENTS

| | | | |
|---|---|---|---|
| 5,449,206 A | 9/1995 | Lockwood | |
| 5,594,339 A * | 1/1997 | Henderson et al. | 324/318 |
| 6,577,888 B1 * | 6/2003 | Chan et al. | 600/422 |
| 6,650,926 B1 | 11/2003 | Chan et al. | |
| 7,053,620 B2 * | 5/2006 | Renz | 324/318 |
| 7,365,542 B1 * | 4/2008 | Rohling et al. | 324/318 |
| 7,382,132 B1 * | 6/2008 | Mathew et al. | 324/318 |
| 2004/0183534 A1 | 9/2004 | Chan et al. | |
| 2005/0174117 A1 | 8/2005 | Greim et al. | |
| 2008/0100294 A1 | 5/2008 | Rohling et al. | |
| 2009/0012389 A1 | 1/2009 | Kundner et al. | |

* cited by examiner

*Primary Examiner* — Louis Arana
(74) *Attorney, Agent, or Firm* — Adrian D. Battison; Ade & Company Inc

(57) ABSTRACT

An apparatus for intra-operative MRI includes a patient table with a movable magnet and an RF coil having an upper portion and a lower portion. The upper portion is formed of a foam material flexible to different shapes with a pair of stiffeners formed of connected pivotal elements extending from a central back-bone embedded in the top sheet of the foam to hold the flexible material in the different shapes and is carried at one end of a flexible foam arm attached to a side rail of the table and stiffened by a longitudinal stiffener. A head clamp is attached to the table with a C-shaped holder for the skull clamp pins. The lower coil is movable by flexing about longitudinal lines to different curvatures and is held channel shaped by the C-shaped holder. It is attached at one longitudinal end to an adjustable mount connected to the head clamp.

19 Claims, 6 Drawing Sheets

RF COIL ASSEMBLY FOR USE IN MAGNETIC RESONANCE IMAGING

This invention relates to a RF coil assembly for use in magnetic resonance imaging. In particular aspects of the invention include a user adjustable semi-rigid flexible foam upper RF coil, a conformable support mechanism for the coil and a support for a lower coil.

BACKGROUND OF THE INVENTION

RF coils of various design are available for use in MR imaging. The coils are used to receive/transmit signal and in order to do this should be positioned directly on or immediately adjacent the human anatomy in an orientation so that the coil lies in a plane which is parallel to the axis of the bore of the magnet.

The coils include a top portion and a bottom portion. In regard to coils for imaging the head, these are generally channel shaped and facing one another so as to envelope the head with side edges which are close or touching so that the head is surrounded by the two coil portions. Each coil portion includes an array of coil elements, typically four, so as to form a phased coil array.

Such coils can be provided as rigid coils or as flexible foam coils. The rigid coils have a specific geometrical shape that can not be changed and are also usually designated for certain anatomy such as the head or chest where they are designed with the required shape to approximate to the average patient.

Flexible coils are known and commercially available. These can be conformed to patient anatomy, but have to be held in place by using external fixation method such as straps with suitable fastening arrangements. That is the flexible coils typically can be bent into the required shape to match the anatomy, but have no ability to remain in that shape due to their elastic nature. Thus they must be fastened into place to maintain the required shape and position.

MR imaging is carried out often in a diagnostic situation where the patient is conscious and not sterile so that the coil can be attached into place by such straps. Thus flexible coils are typically or commonly used in this situation since the fastening is not a problem.

In another field of use, MR imaging is carried out in an intra-operative situation where the patient is unconscious and draped to maintain sterility. In this case, due to difficulty of cleaning or sterilizing the straps, the use of flexible coils in intra-operative applications is limited. Thus, up to now, typically rigid coils have been used in this situation with the coils mounted rigidly from a suitable support such as the bed frame or a head fixation device. Coils, whether rigid or flexible, that are used for neurosurgical applications generally have rigid attachment to the patient table or directly to the patient, which makes the mechanical/geometrical adjustment of the coil difficult or impossible.

Such rigid coils can be sterilized as required. However they provide only a compromise in relation to the position of the coil antenna relative to the anatomy of the patient. As is well known, improved images are obtained where the antenna is located in the best position relative to the anatomy concerned and best orientation relative to the magnetic field. Thus the best images are obtained with the closest proximity combined with an orientation which is closest to parallel to the longitudinal axis of the bore, as opposed to being at an angle to the longitudinal axis. As rigid coils are necessarily sized to fit all, in many cases they do not properly fit the patient. Also the mounting typically is restrictive as to the ability to properly orient the coil

SUMMARY OF THE INVENTION

It is one object of the invention to provide an improved RF coil construction.

According to one aspect of the invention there is provided an apparatus for use in Magnetic Resonance imaging of a part of a patient comprising:
patient support table;
a magnet arranged to generate a magnetic field at the patient support table;
an RF coil for use in the MR imaging;
the RF coil including an upper coil portion for location on top of the patient and a lower coil portion for location underneath the patient;
wherein the upper coil is formed of a flexible material allowing the coil to be flexed to different shapes with at least one stiffening element attached to the flexible material and movable therewith and having a resistance to bending which is arranged such that said at least one stiffening element acts to hold the flexible material in the different shapes.

Preferably the flexible material is comprised of foam.

Preferably said at least one stiffening element is embedded in the foam.

Preferably the coil is generally channel shaped and is movable by flexing to different curvatures.

Preferably the coil comprises a panel member which is movable by flexing from a flat condition to different curvatures.

Preferably the stiffening element extends transversely across the coil.

The coil may include at least one longitudinal backbone member and the stiffening element extends at right angles to the backbone member. However this can be omitted and the coil may be stiffened only by the stiffening elements.

Preferably there are two stiffening members each on a respective side of the backbone, if used, member and spaced longitudinally of the backbone member.

Preferably the stiffening member comprises a plurality of separate pieces each connected to the next along the length of the stiffening member and each pivotally movable relative to the next.

This arrangement can be of the type shown in U.S. Pat. No. 5,449,206 (Lockwood) issued Sep. 12, 1995 and assigned to Lockwood Products, the disclosure of which is incorporated herein by reference.

Preferably the stiffening member is located in a raised rib on the flexible material.

Preferably the flexible material comprises two sheets of a foam material fastened together at a center plane of the coil with components of the coil located at the center plane and with said at least one stiffening element being embedded in one sheet.

Preferably the upper coil is carried at one end of a flexible arm for movement of the upper coil to different locations relative to the patient, an opposite end of the arm being carried on a location fixed relative to the patient support table.

Preferably the opposite end of the arm is attached to a side rail of the patient support table.

Preferably the flexible arm is flexible along its full length.

Preferably the flexible arm is one piece.

Preferably the flexible arm is formed of foam with a stiffening element along the length of the arm.

Preferably the coil includes a housing with a sleeve to which is attached an RF cable and wherein the flexible arm includes at said one end a clamp for engagement onto the sleeve of the housing so that the arm at the housing is parallel to the RF cable.

Preferably the coil includes a housing with a sleeve to which is attached an RF cable and wherein the flexible arm includes at said one end a clamp the housing and wherein the coil includes at least one longitudinal backbone member rigidly connected to the housing and said at least one stiffening element extends at right angles to the backbone member.

Preferably there is provided a head clamp attached to the patient support table for holding the head of the patient stationary for an invasive procedure, wherein the lower coil is generally channel shaped and is movable by flexing about longitudinal lines to different curvatures, and wherein the lower coil is attached at one longitudinal end to an adjustable mount connected to the head clamp and wherein the adjustable mount is adjustable to allow movement of the end of the lower coil relative to the head clamp.

Preferably the adjustable mount is arranged after adjustment to hold the end of the lower coil at a rigidly fixed location.

Preferably the adjustable mount provides 6 degrees of freedom of movement.

Preferably the head clamp includes a C-shaped clamp section into which the head of the patient is placed with the lower coil between the head of the patient and the C-shaped clamp section and wherein the C-shaped clamp section is arranged to engage and hold the lower coil in one of said different curvatures.

Preferably the adjustable mount is arranged to engage the lower coil on a longitudinal center line of the lower coil and wherein the adjustable mount is arranged to allow movement of the center line of the lower coil to different angles and positions relative to a plane containing the C-shaped clamp section while the lower coil remains in engagement with and held by the C-shaped clamp section.

According to a second aspect of the invention there is provided an apparatus for use in Magnetic Resonance imaging of a part of a patient comprising:

patient support table;

a magnet arranged to generate a magnetic field at the patient support table;

an RF coil for use in the MR imaging;

the RF coil including an upper coil portion for location on top of the patient and a lower coil portion for location underneath the patient;

wherein the upper coil is carried at one end of a flexible arm for movement of the upper coil to different locations relative to the patient, an opposite end of the arm being carried on a location fixed relative to the patient support table.

According to a third aspect of the invention there is provided an apparatus for use in Magnetic Resonance imaging of a part of a patient comprising:

patient support table;

a magnet arranged to generate a magnetic field at the patient support table;

an RF coil for use in the MR imaging;

the RF coil including an upper coil portion for location on top of the patient and a lower coil portion for location underneath the patient;

a head clamp attached to the patient support table for holding the head of the patient stationary for an invasive procedure;

wherein the lower coil is generally channel shaped and is movable by flexing about longitudinal lines to different curvatures;

wherein the lower coil is attached at one longitudinal end to an adjustable mount connected to the head clamp;

and wherein the adjustable mount is adjustable to allow movement of the end of the lower coil relative to the head clamp.

The invention also includes the construction of the upper coil portion with its support arm as an element separate from the apparatus and also the lower coil portion with its adjustable support mount as an element separate from the apparatus.

The coil construction of the present invention is not limited to intra-operative use in imaging the head, but can be used in many MR applications such a head, neck and heart coil for both diagnostic and intra-operative modalities. It can work for extremities (e.g. legs, elbows) as well. The arrangement described herein can provide more flexibility in use, can be user friendly and safer to use due to lack of additional conformation devices.

The coil adjustability device described herein, can allow the user to adjust the position of the coil in relation to patient anatomy without touching the patient, which will be a benefit to the patient safety. It will allow positioning the coil in the optimal way, which will increase image quality.

Although the coil as described herein is built of flexible material it can allow conformation of the coil shape to the anatomy at the region of interest, this fact will improve dramatically image quality.

The coil adjustability device described herein using adjustable semi-rigid flexible foam coil can allow the conforming to the anatomy without using any external devices, such a mechanical interfaces, straps or Velcro straps.

The use of the semi-rigid flexible foam coil as described herein can provide several advantages:

a) It does not have the rigid geometry that will prevent from positioning of the coil in the most optimum way and on the right anatomy (region of interest) of the patient.

b) There is no additional devices will require to conform the coil, such a straps, Velcro straps or mechanical devices.

The use of the conformable support method as described herein for surgical coils can provide several advantages:

a) It will allow up to six degrees of freedom in the coil positioning.

b) It will provide the flexibility of adjustment of the coil relative to the anatomy fixation devices.

c) It will allow positioning of the coil directly onto the region of interest, without touching this region as the coil is suspended.

d) It will allow positioning of the coil in the optimal way relatively to the field of view, which can improve the image quality dramatically.

BRIEF DESCRIPTION OF THE DRAWINGS

One embodiment of the invention will now be described in conjunction with the accompanying drawings in which.

In the drawings like characters of reference indicate corresponding parts in the different figures.

DETAILED DESCRIPTION

Figure 1:
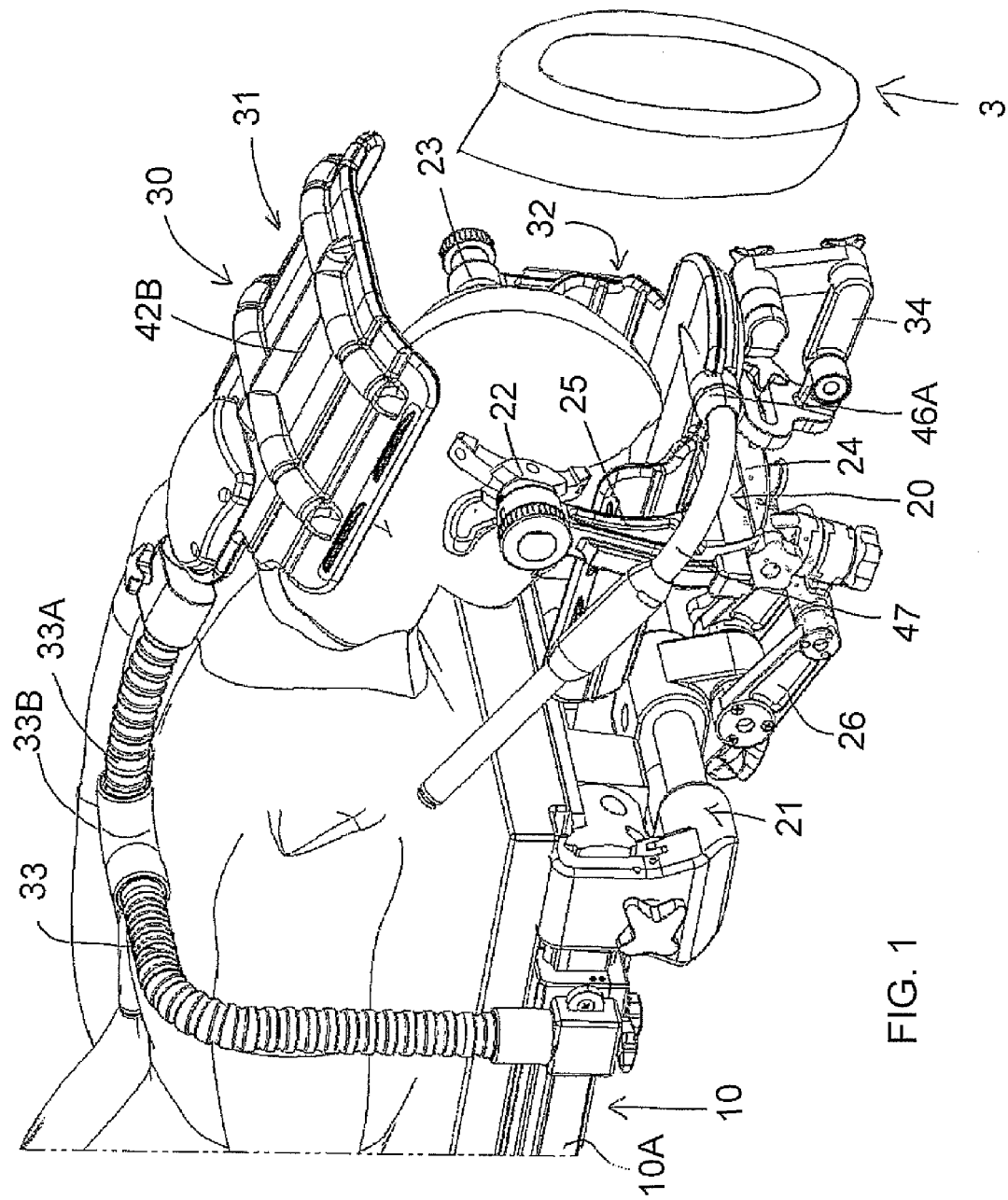
FIG. 1 is an isometric view of an apparatus for MR imaging showing a patient table, an MRI magnet movable into a position for imaging the patient on the table, a head clamp and an RF coil arrangement including an upper portion and a lower portion according to the present invention.

In FIG. 1 is shown an arrangement for carrying out Magnetic Resonance Imaging of a patient while the patient remains stationary on a patient support table. The arrangement provides a room in which is mounted a patient support table 10 with doors at one side of the room for entry into the room of a magnet 3 of an MR imaging system from a magnet bay. The table 10 described and illustrated herein is used in an arrangement where the patient remains in position on the table during surgery and while imaging is effected intra-operatively or post-operatively using MRI.

The MR is a high-field (e.g. 1.5 T or 3 T) magnet that moves on overhead rails between the two or more rooms as described above. The arrangement may be used in a typical three room configuration with the Angiography Room (AR) on the left, a Diagnostic Room (DR) in the middle, and an Operating Room on the right. The magnet moves on overhead rails between the rooms and can image in each.

The Patient Handling System or support table is indicated generally at 10. The patient support table includes a base of a conventional construction which allows the base to move a patient support portion to required locations in height and in orientation. Suitable drive mechanisms and couplings are known in the art and thus are not required to be described herein. At the top of the base is mounted the patient support portion in the form of a generally planar body formed of a fiber reinforced plastics material so as to define a surface area sufficient for supporting the patient while lying on the patient support portion.

The apparatus includes a head clamp 20 which is connected onto the end of the table 10 by a mounting bracket 21. The details of these components are well known to a person skilled in this art and can vary so that they are not described herein. It suffice to say that the head clamp includes a C-shaped clamp section and a pair of skull clamp pin members 22 and 23 which engage respective sides of the skull to hold the head in place at a fixed position for surgery and for imaging.

The C-shaped clamp section includes a base portion 24 which is adjustable in width with a pair of upstanding arms 25 each of which carries a respective pin member 22, 23 at its upper end.

Figure 2:
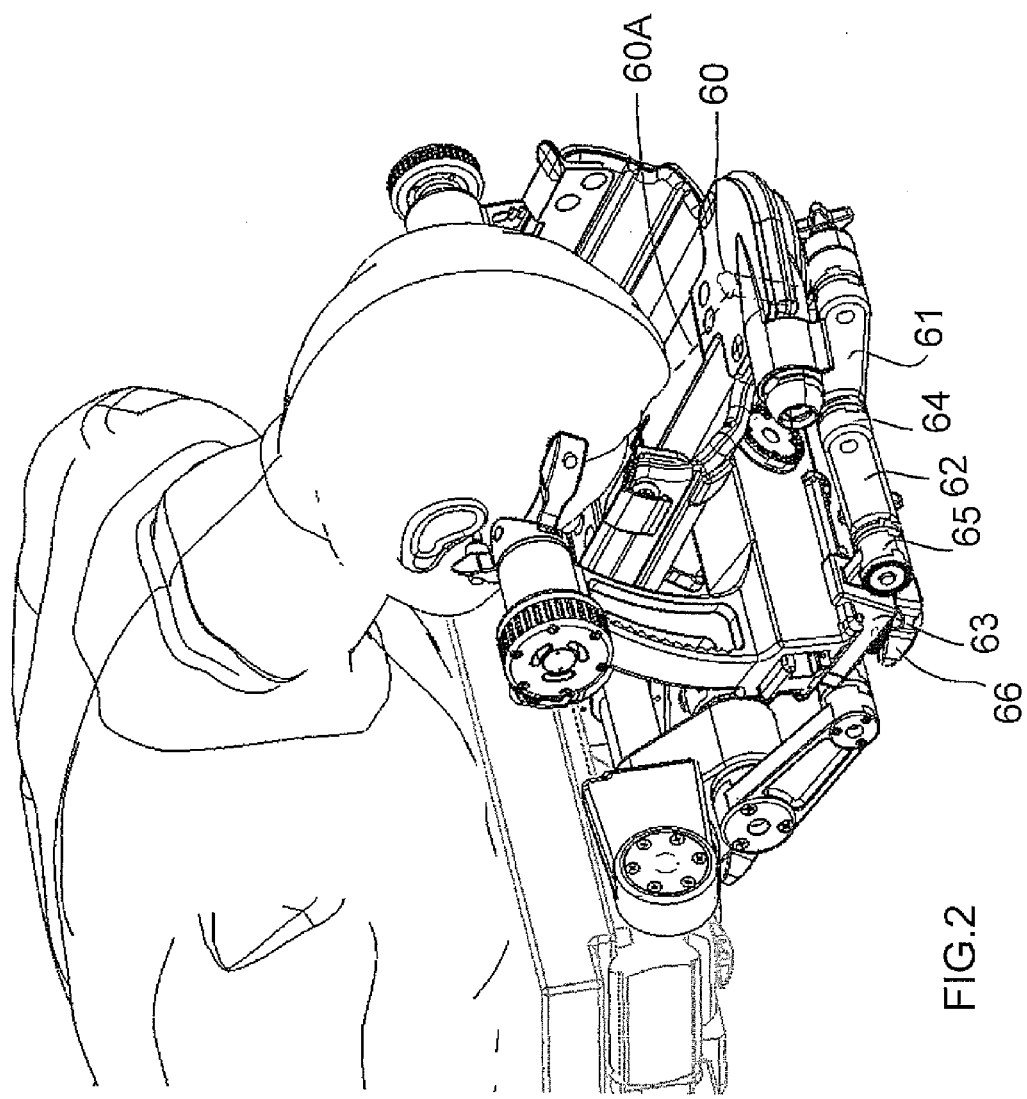
FIG. 2 is an isometric view from one side of the head clamp and lower coil portion of FIG. 1.
Figure 3:
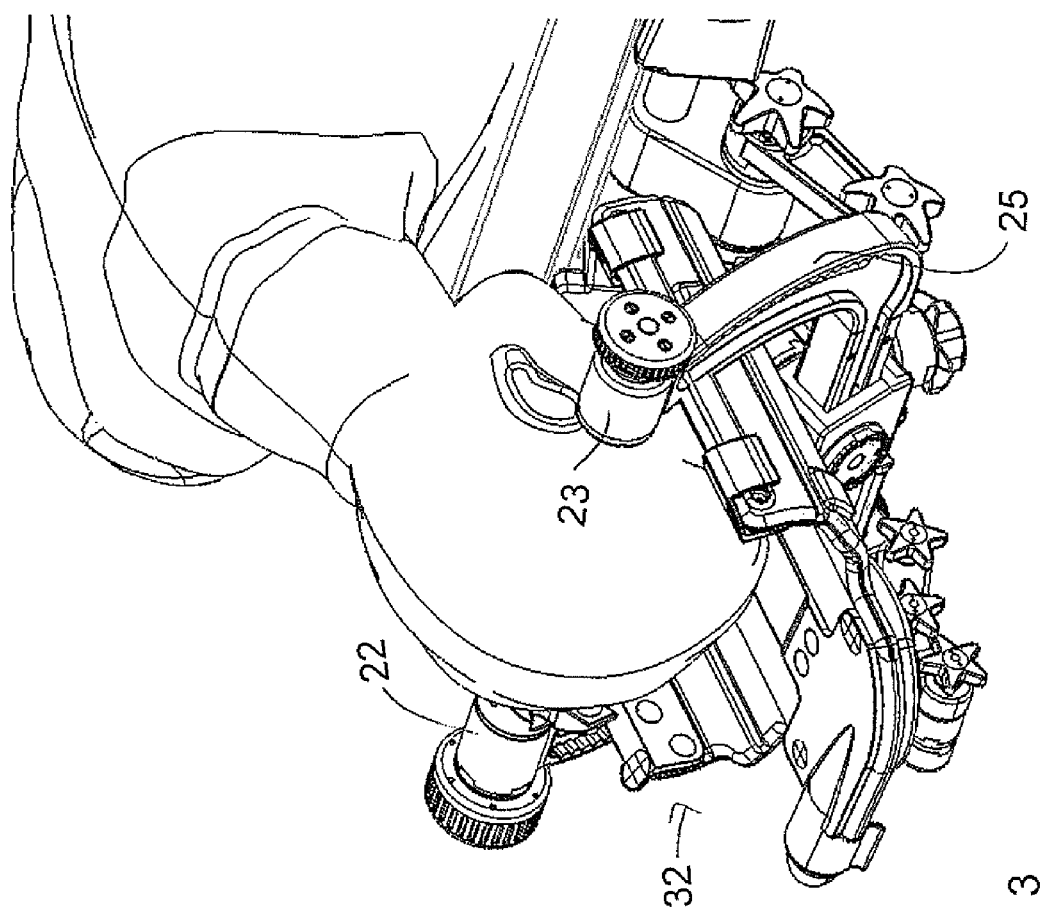
FIG. 3 is an isometric view from the front end of the head clamp and lower coil portion of FIG. 1.

The C-shaped clamp section is carried on a bracket 26 which includes a plurality of interconnected and adjustable arms which allow the C-shaped clamp section to be adjusted in a number of direction so that the plane of the clamp section can be moved side to side, up and down, and can be tilted around axes generally longitudinal of the patient support table and generally transverse to the patient support table. Thus as shown in FIGS. 2 and 3, the clamp section 24 is tilted forwardly of a vertical plane to move the clamp pin members forwardly. It is also possible that the clamp section 24 can be rotated around an axis longitudinal to the table so that one clamp pin member is higher than the other.

The apparatus further includes an RF coil 30 formed of top coil portion 31 and a bottom coil portion 32. These are each formed of a plurality of antennae elements so that they cooperate around the head to form a phased array. The top coil portion 31 is carried on a support arm 33 connected to the side rail 10A of the table 10. The bottom coil portion is carried on an adjustable bracket 34 which is rigid but can be adjusted so as to move the connection at the front of the bottom coil relative to the head clamp.

Figure 4:
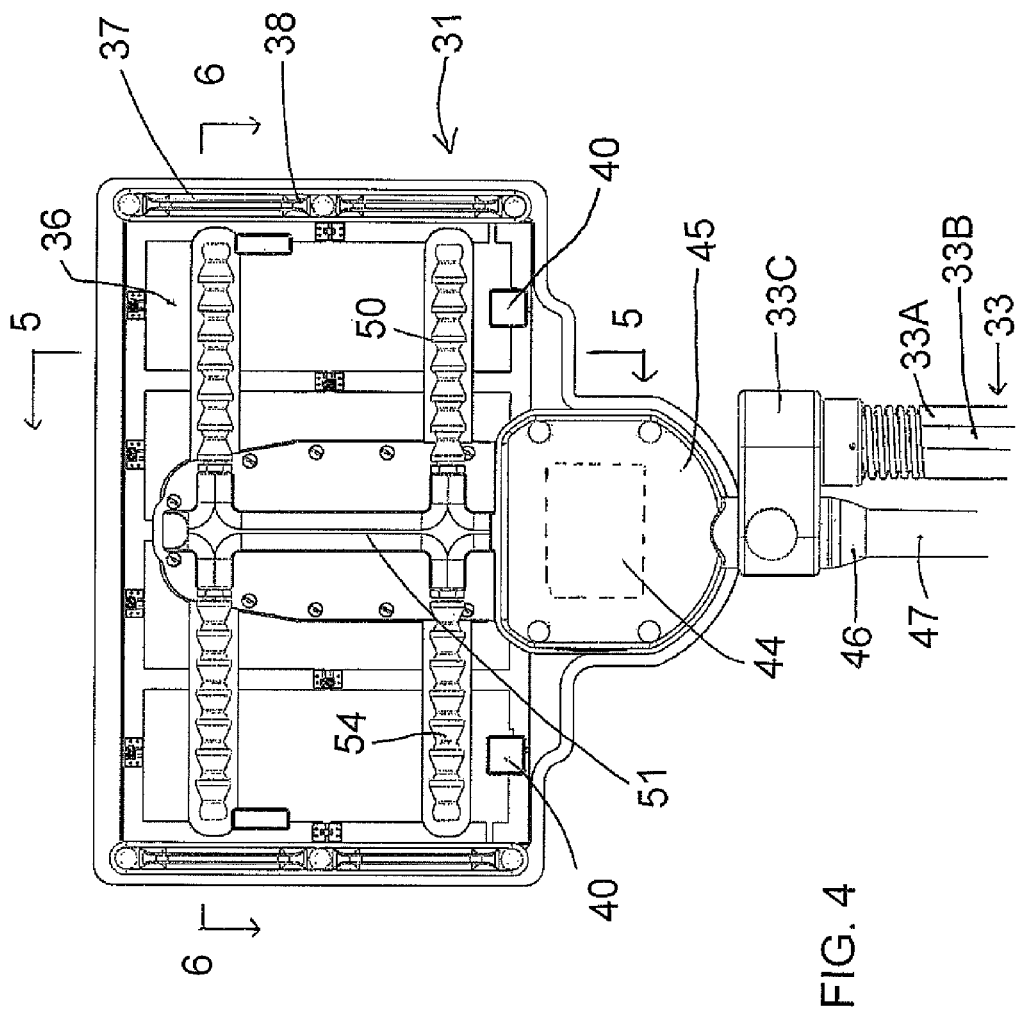
FIG. 4 is a top plan view of the RF coil of FIG. 1 with the top foam sheet removed to expose the interior construction.

A schematic illustration of the RF coil 31 is shown in FIG. 4 and includes a printed circuit board 36. The board is formed of polyimide film (Kapton™) which is a flexible substrate onto which the antennae are formed as conductive traces and on which are carried the various circuit components well known to be required in such coil constructions. The circuitry of the coil includes conductive traces 37, capacitors 38, diodes 40, and pre-amplifiers 44. All of these elements are conventional in general construction and are well known to persons skilled in the art of coil design so that detailed explanation is not required here.

The upper and lower coil portions are basically formed in the same construction to provide a flexible arrangement to allow the coil portions to take up a generally U-shaped configuration in which the bottom of the legs of the U-shape of the top coil portion meet or lie closely adjacent the top of the legs of the bottom coil to provide the surrounding arrangement.

Figure 5:
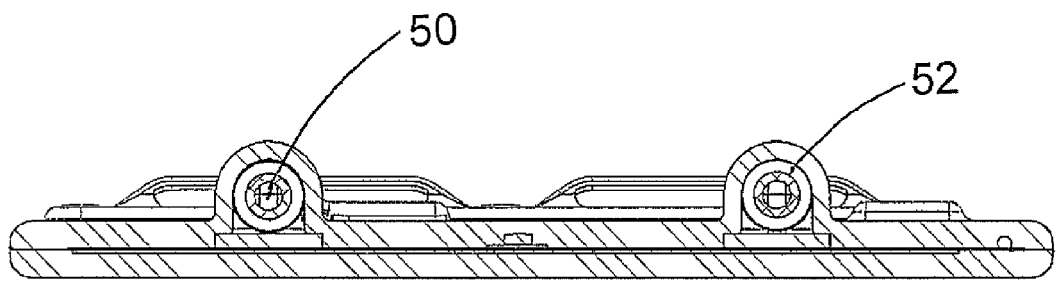
FIG. 5 is a cross sectional view along the lines 5-5 through the RF coil of FIG. 4.
Figure 6:
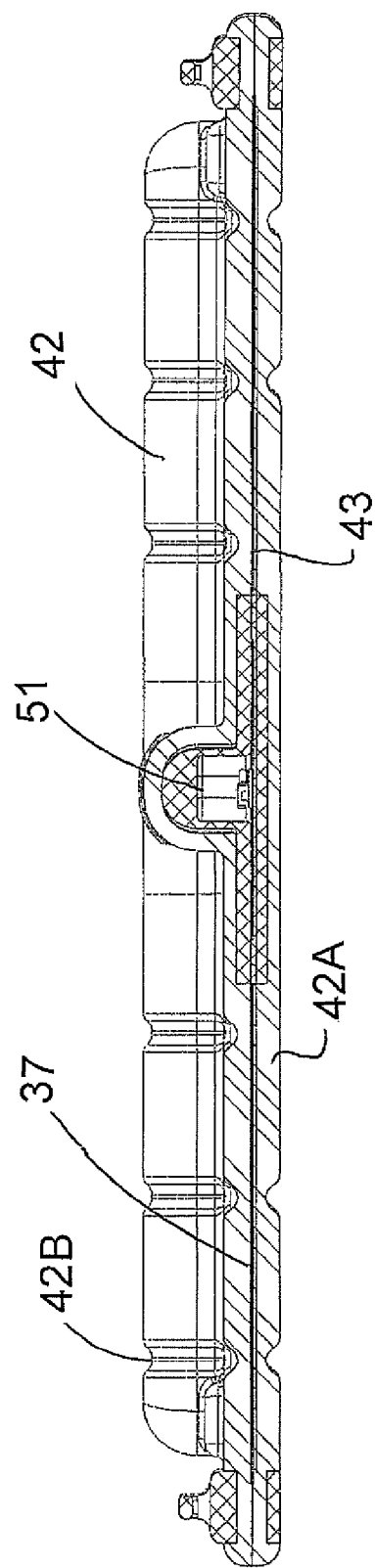
FIG. 6 is a cross sectional view along the lines 6-6 through the RF coil of FIG. 4.

In each case the coil portion is formed of a foam flexible material 42 allowing the coil to be flexed to different shapes. In particular, as shown in the cross-sections of FIGS. 5 and 6, the flexible material comprises two sheets 42A and 42B of a foam material fastened together at a center plane 43 of the coil with the components of the coil on the flexible circuit board 36 located at the center plane. Thus the coil portion is movable by flexing from a flat condition to different curvatures where it is generally channel shaped and is movable by flexing to different curvatures.

The two overlying sheets of foam material are coextensive with the board 36 spaced inwardly from the side edges. The components of the circuit are also embedded in the foam material. The thickness of the foam material is selected to allow the required degree of flexing. The foam material may be notched at spaced positions across the panel to localize the flexing action at preferred positions with those preferred positions being located mid way across the sections of the antenna so as to minimize bending at regions where components 38, 40 are located on the circuit board 36.

The antennae and their pre-amplifiers connect to a central unit 44 mounted in a housing 45 at one edge of the panel. The housing connects to a neck 46 to which the RF cable 47 is attached to pas from the RF coil to the control system at a remote location.

Such flexible RF coil constructions are known. Typically they have some elasticity which prevents their taking up and retaining the required shape closely surrounding the anatomy of the patient.

In respect of the top coil portion, in order to maintain the required shape of the panel forming the coil portion, there is provide at least one stiffening element 50 attached to the flexible foam material and movable therewith. The stiffening elements 50 provide a resistance to bending which is arranged such that the stiffening elements act to hold the flexible material in the different shapes.

The coil 41 includes at least one longitudinal backbone member 51 connected to the housing 45 and extending longitudinally along the panel forming the coil construction. This holds the central axis straight so that bending occurs only about lines parallel to this central axis. The stiffening elements 50 extend at right angles to the backbone member and are fastened to it at spaced positions along the backbone member. The backbone member allows the coil 41 to be held in place by a flexible arm 33 connected to the neck 56. The backbone member and the stiffening elements are embedded in the top sheet of the foam preferably by adding foam ribs 52 molded into the top sheet of foam.

Thus the stiffening elements extend transversely across the coil and act to hold the coil in the required selected channel shape at the required curvature.

There are preferably two stiffening members each on a respective side of the backbone member and spaced longitudinally of the backbone member but more than two members can be used.

The stiffening members could be comprised of a continuous length installed without a central backbone member if the coil is intended to be formed into a continuous radius without a central flat section. The stiffening elements can also be arranged in a 'H' shape that allows some limited curvature in the head-foot direction (superior-inferior)

The stiffening members comprise a plurality of separate pieces 54 each connected to the next along the length of the stiffening member and each pivotally movable relative to the next. Such a material is commercially available for forming bendable ducts. A suitable supplier of such material is Lockwood Products Inc (Lake Oswego, Oreg.). It has sufficient resistance to bending as to provide the required holding forces although other materials of a similar nature can be used and particularly a material that has a thinner profile than material available from this supplier.

The upper coil 31 is carried at one end of the flexible arm 33 for movement of the upper coil to different locations relative to the patient, an opposite end of the arm 33 being carried on a location fixed relative to the patient support table and in this example at the side rail 10A. The flexible arm comprises a single piece which is flexible along its full length so that it can be bent to the required orientation to place the top coil portion at the required location. The intention is that the arm just has sufficient stiffness to hold the coil portion in place with possibly some support coming from minor contact with the anatomy of the patient. The flexible arm is formed of a foam material 33A forming an elongate element of constant cross-section with a stiffening element 33B along the length of the arm of the same construction as that described above. The dimensions of the stiffening element may be greater to provide an increased holding force.

In order to mount the arm 33 to the coil portion, the flexible arm 33 includes at its end a clamp 33C for engagement onto the sleeve 46 of the housing 45 at one side of the sleeve so that the arm 33 at the housing 45 is parallel to the RF cable 47. The arm 33 then extends generally along the chest of the patient before diverging to one side to connect to the side rail. The RF cable extends along the required route to the control system.

The head clamp is thus attached to the patient support table for holding the head of the patient stationary for an invasive procedure. The lower coil 32 is generally channel shaped when curved into its operating position and is movable by flexing about longitudinal lines to different curvatures.

The lower coil is similar in construction to that shown in FIG. 4 and includes a housing 45 at one end as previously described. In this arrangement however the sleeve 46A to the cable 47 extends to one side rather than along the centerline. This leaves room for a mounting pin 60 which extends through the housing at the centerline in a direction at right angles to the centerline so as to engage onto an outer end of the adjustable bracket 34 connected to the head clamp.

The bracket 35 is defined by the pin 60 and a series of arms 61, 62, and 63 connected by swivel couplings 64, 65 and 66 so that the adjustable mount is adjustable to allow movement of the end of the lower coil relative to the head clamp. The pin 60 allows rotational movement about the longitudinal axis of the pin. The coupling 66 allows rotational movement about an axis transverse to the head clamp. The couplings 64 and 65, which are of the type known as "starburst" mountings with two facing toothed plates allowing adjustment of the angle between the plates, allow repositioning of the pin relative to the head clamp. In this way the orientation of the pin and therefore the longitudinal center line of the coil portion 32 can be adjusted in six degrees of freedom.

The adjustable mount is arranged after adjustment to hold the end of the lower coil at a rigidly fixed location. In this way the head clamp can be adjusted to hold the head of the patient at a desired location for the surgical intervention. With the clamp in its required position, the pin 60 and therefore the center line 60A of the coil portion can be adjusted so that the center line 60A is as close to parallel to the axis of the magnet bore as possible to provide the best imaging. The remainder of the coil portion is then held in place by the C-shaped mounting 25 which cups and locates the coil portion into its required channel shape. As shown in the figures, this allows the C-shaped bracket 25 to take up different positions inclined to the required angle which is shown for example inclined forwardly but it can also be inclined to one side. The positioning of the forward end of the coil portion locates the coil portion relative to the C-shaped clamp and thus locates the coil portion in the best position and orientation for imaging.

Thus the head clamp includes a C-shaped clamp section into which the head of the patient is placed with the lower coil between the head of the patient and the C-shaped clamp section and the C-shaped clamp section is arranged to engage and hold the lower coil in the required one of the different curvatures to match the space between the head clamp and the head.

In this way both the upper and lower coil portions are flexible to provide the best position for imaging and are held in place in the best orientation by the top flexible arm 33 and by the combination of the mounting 34 and the head clamp without the necessity for additional fastening elements.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. Apparatus for use in Magnetic Resonance imaging of a part of a patient comprising:
   a patient support table;
   a magnet arranged to generate a magnetic field at the patient support table;
   an RF coil for use in the MR imaging;
   the RF coil including an upper coil portion for location on top of the patient and a lower coil portion for location underneath the patient;
   the upper coil portion having two side edges, a front edge and a rear edge;
   wherein the upper coil portion is formed of a flexible material allowing the coil to be flexed about axes parallel to the side edges to form different arch shapes by flexing of the flexible material;
   with at least one stiffening member attached to the flexible material and movable therewith and having a resistance to bending which is arranged such that said at least one stiffening member acts to hold the flexible material in the different arch shapes;

said at least one stiffening member comprising an elongate body extending across the upper coil portion in a direction transverse to the side edges of the upper coil portion at a position spaced from the front and rear edges;

wherein said at least one stiffening member comprises a plurality of separate pieces each connected to the next along the length of the elongate body;

and wherein each piece is pivotally movable relative to the next so that bending of the stiffening member occurs by the pivotal movement between each piece and the next.

2. The apparatus according to claim 1 wherein the flexible material comprises a foam and said at least one stiffening member is embedded in the foam.

3. The apparatus according to claim 1 wherein said at least one stiffening member is located in a raised rib on the flexible material.

4. The apparatus according to claim 1 wherein the flexible material comprises two sheets of a foam material fastened together at a center plane of the coil with components of the coil located at the center plane and with said at least one stiffening member being embedded in one sheet.

5. The apparatus according to claim 1 wherein the upper coil portion is carried at one end of a flexible arm for movement of the upper coil portion to different locations relative to the patient, an opposite end of the arm being carried on a location fixed relative to the patient support table.

6. The apparatus according to claim 5 wherein the opposite end of the arm is attached to a side rail of the patient support table.

7. The apparatus according to claim 5 wherein the flexible arm is flexible along its full length.

8. The apparatus according to claim 5 wherein the flexible arm is one piece.

9. The apparatus according to claim 5 wherein the flexible arm is formed of a foam with a stiffening element along the length of the arm.

10. The apparatus according to claim 5 wherein the coil includes a housing with a sleeve to which is attached an RF cable and wherein the flexible arm includes at said one end a clamp for engagement onto the sleeve of the housing so that the arm at the housing is parallel to the RF cable.

11. The apparatus according to claim 5 wherein the coil includes a housing with a sleeve to which is attached an RF cable and wherein the flexible arm includes at said one end a clamp the housing and wherein the upper coil portion includes at least one longitudinal backbone member rigidly connected to the housing and said at least one stiffening member extends at right angles to the backbone member.

12. The apparatus according to claim 1 wherein there is provided a head clamp attached to the patient support table for holding the head of the patient stationary for an invasive procedure, wherein the lower coil portion is generally channel shaped and is movable by flexing about longitudinal lines to different curvatures, and wherein the lower coil portion is attached at one longitudinal end to an adjustable mount connected to the head clamp and wherein the adjustable mount is adjustable to allow movement of the end of the lower coil portion relative to the head clamp.

13. The apparatus according to claim 12 wherein the adjustable mount is arranged after adjustment to hold the end of the lower coil portion at a rigidly fixed location.

14. The apparatus according to claim 12 wherein the adjustable mount provides 6 degrees of freedom of movement.

15. The apparatus according to claim 12 wherein the head clamp includes a C-shaped clamp section into which the head of the patient is placed with the lower coil portion between the head of the patient and the C-shaped clamp section and wherein the C-shaped clamp section is arranged to engage and hold the lower coil portion in one of said different curvatures.

16. The apparatus according to claim 15 wherein the adjustable mount is arranged to engage the lower coil portion on a longitudinal center line of the lower coil portion and wherein the adjustable mount is arranged to allow movement of the center line of the lower coil portion to different angles and positions relative to a plane containing the C-shaped clamp section while the lower coil portion remains in engagement with and held by the C-shaped clamp section.

17. Apparatus for use in Magnetic Resonance imaging of a part of a patient comprising:

a patient support table;

a magnet arranged to generate a magnetic field at the patient support table;

an RF coil for use in the MR imaging;

the RF coil including an upper coil portion for location on top of the patient and a lower coil portion for location underneath the patient;

the upper coil portion having two side edges, a front edge and a rear edge;

wherein the upper coil portion is formed of a flexible material allowing the coil to be flexed about axes parallel to the side edges to form different arch shapes by flexing of the flexible material;

with stiffening components attached to the flexible material to hold the flexible material in the different arch shapes;

wherein the stiffening components includes at least one longitudinal backbone member extending from the front edge generally parallel to the side edges and at least one stiffening member defined by an elongate body which extends at right angles to the backbone member;

said at least one stiffening member having a resistance to bending which is arranged such that said at least one stiffening member acts to hold the flexible material in the different arch shapes;

wherein said at least one stiffening member comprises a plurality of separate pieces each connected to the next along the length of the elongate body;

wherein each piece is pivotally movable relative to the next so that bending of the stiffening member occurs by the pivotal movement between each piece and the next.

18. The apparatus according to claim 17 wherein there are two stiffening members spaced longitudinally of the backbone member.

19. Apparatus for use in Magnetic Resonance imaging of a part of a patient comprising:

a patient support table;

a magnet arranged to generate a magnetic field at the patient support table;

an RF coil for use in the MR imaging;

the RF coil including an upper coil portion for location on top of the patient and a lower coil portion for location underneath the patient;

the upper coil portion having two side edges, a front edge and a rear edge;

wherein the upper coil portion is formed of a flexible material allowing the coil to be flexed about axes parallel to the side edges to form different arch shapes by flexing of the flexible material;

with at least one stiffening member attached to the flexible material and movable therewith and having a resistance to bending which is arranged such that said at least one stiffening member acts to hold the flexible material in the different arch shapes;

said at least one stiffening member comprising an elongate body extending across the upper coil portion in a direction transverse to the side edges of the upper coil portion;

wherein said at least elongate body defining said stiffening member is located in a raised rib on the flexible material;

wherein said at least one stiffening member comprises a plurality of separate pieces each connected to the next along the length of the elongate body;

and wherein each piece is pivotally movable relative to the next so that bending of the stiffening member occurs by the pivotal movement between each piece and the next.

* * * * *